(12) United States Patent
Kim

(10) Patent No.: US 8,072,034 B2
(45) Date of Patent: Dec. 6, 2011

(54) ARRAY SUBSTRATE AND METHOD OF MANUFACTURING THE SAME

(75) Inventor: Dong-Gyu Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 12/582,672

(22) Filed: Oct. 20, 2009

(65) Prior Publication Data

US 2010/0038640 A1  Feb. 18, 2010

Related U.S. Application Data

(63) Continuation of application No. 11/210,355, filed on Aug. 23, 2005, now Pat. No. 7,625,782.

(30) Foreign Application Priority Data

Aug. 24, 2004  (KR) .................................. 2004-66922

(51) Int. Cl.
    *H01L 21/70* (2006.01)
(52) U.S. Cl. .............................. 257/390; 257/59; 257/72
(58) Field of Classification Search .................... 257/59, 257/72, 390, E21.521
    See application file for complete search history.

(56) References Cited

U.S. PATENT DOCUMENTS

| 6,246,074 B1 * | 6/2001 | Kim et al. ..................... 257/48 |
| 6,590,624 B1 * | 7/2003 | Lee ................................. 349/54 |
| 6,734,925 B1 * | 5/2004 | Lee et al. ...................... 349/40 |
| 6,784,862 B2 * | 8/2004 | Kodate et al. ................... 345/92 |
| 7,268,838 B2 * | 9/2007 | Lim ................................. 349/40 |
| 7,379,126 B2 * | 5/2008 | Kim et al. ...................... 349/40 |

FOREIGN PATENT DOCUMENTS

| JP | 2002-277896 | 9/2002 |
| KR | 1999-0047650 A | 7/1999 |

OTHER PUBLICATIONS

English Abstract, Publication No. JP 2002-277896.

* cited by examiner

*Primary Examiner* — Kenneth Parker
*Assistant Examiner* — Anthony Ho
(74) *Attorney, Agent, or Firm* — Innovation Counsel LLP

(57) ABSTRACT

According to an embodiment of the invention, an array substrate includes a first test line, a second test line, a first source line group, a second source line group, a plurality of gate lines and a switching device. The first test line extends along a first direction. The second test line is substantially in parallel with the first test line. The first source line group that extends along a second direction that is substantially perpendicular to the first direction, and electrically connected to the first test line. The second source line group extends along the second direction and is electrically connected to the second test line. Each of the gate lines extends along the first direction. The switching device is formed on a region surrounded by the first source line, the second source line and the gate lines. Therefore, defects induced by static electricity generated during manufacturing process are reduced.

27 Claims, 18 Drawing Sheets

ARRAY SUBSTRATE AND METHOD OF MANUFACTURING THE SAME

CROSS-REFERENCE TO RELATED APPLICATIONS

This is a continuation application of U.S. patent application Ser. No. 11/210,355, filed on Aug. 23, 2005, which relies for priority upon Patent Application No. 2004-66922 filed in the Korean Intellectual Property Office, Republic of Korea, on Aug. 24, 2004, the entire contents of which are incorporated herein by reference.

BACKGROUND OF THE INVENTION

1. Field of the Invention

The present invention relates to an array substrate and a method of manufacturing the array substrate. More particularly, the present invention relates to an array substrate capable of reducing defects induced by static electricity generated during manufacturing process, and a method of manufacturing the array substrate.

2. Description of the Related Art

A liquid crystal display panel typically includes an array substrate, an upper substrate facing the array substrate, and a liquid crystal layer disposed between the array substrate and the upper substrate, where the array substrate includes a pixel region and a signal applying region. The pixel region includes a source line that extends in a first direction, a gate line that extends in a second direction that is substantially perpendicular to the first direction, and a pixel electrode that is electrically connected to the source line through a switching device. The signal applying region includes a first driving chip pad upon which a data driving chip that applies a data signal to the source line is mounted, and a second driving chip pad upon which a gate driving chip that applies a gate signal to the gate line is mounted.

When the array substrate is completely formed, a wiring test for inspecting electrical conditions of conductive lines formed on the array substrate is performed and then the array substrate is combined with the upper substrate such that a liquid crystal layer is disposed between the array substrate and the upper substrate. Then, a visual inspection (referred to as V/I) process for inspecting electrical and optical conditions of a display panel is performed.

Test lines and test pads for the wiring test process and the V/I process are respectively disposed along scribe lines of a mother board including a plurality of array substrates. In detail, the wiring test pad is disposed on outside regions of the scribe lines (or outside regions of the array substrate), while the V/I pad is disposed on an inside region of the scribe lines (or edge portions of the array substrate). The wiring test lines and V/I lines are disposed on the inside region of the scribe lines. The wiring test lines and the V/I lines are commonly used.

The V/I is performed by the V/I lines and the V/I pad disposed on the inside scribe line region, after the wiring test process is carried out and the array substrate is cut along the scribe line of the mother substrate. In the wiring test and V/I process, the gate lines and the source lines are grouped by certain units (for example, 2G2D or 2G3D) and tested by applying test signals.

According to a widely used wiring test, even numbered gate lines and odd numbered gate lines are grouped, respectively and the even numbered gate line group and the odd numbered gate line group are connected to different static current discharging wirings from each other, and test signal is applied to each of the even numbered gate line group and the odd numbered gate line group. Additionally, even numbered source lines and odd numbered source lines are grouped, respectively, and the even numbered source line group and the odd numbered source line group are connected to separate static current discharge wires from each other, and a test signal is applied to each of the even numbered source line group and the source numbered gate line group.

The odd numbered gate lines and even numbered gate lines alternate with each other, so that each of the odd numbered gate lines is adjacent to each of the even numbered gate lines, so that an electrical short defect may be detected between the odd numbered gate lines and the even numbered gate lines Therefore, the even numbered gate lines are grouped and the odd numbered lines are grouped. The same process described above may also be applied to the V/I process.

BRIEF SUMMARY OF THE INVENTION

An embodiment of the invention provides an array substrate capable of reducing defects induced by static electricity generated during a manufacturing process. An embodiment of the invention also provides a method of manufacturing the array substrate.

In an exemplary array substrate according to an embodiment of the present invention, the array substrate includes a first test line, a second test line, a first source line group, a second source line group, a plurality of gate lines and a switching device. The first test line extends along a first direction, while the second test line is substantially parallel to the first test line. The first source line group extends along a second direction that is substantially perpendicular to the first direction, and is electrically connected to the first test line. The second source line group extends along the second direction and is electrically connected to the second test line. Each of the gate lines extends along the first direction. The switching device is formed on a region surrounded by the first source line, the second source line and the gate lines.

For example, the array substrate further comprises a pixel electrode layer that is electrically coupled to the switching device, and the first test line and the first source line group are electrically connected to each other by a bridge pattern having a same material as that of the pixel electrode layer. The array substrate further comprises a pixel electrode layer electrically coupled to the switching device, and the second test line and the second source line group are electrically connected to each other by a bridge pattern having a same material as that of the pixel electrode layer. The first source line group corresponds to odd numbered source lines while the second source line group corresponds to even numbered source lines, or vice versa. The array substrate further comprises a pixel electrode that is electrically coupled to the switching device, and a first bridge pattern that electrically couples the first source line with the first test line. The pixel electrode and the first bridge pattern are formed from the same layer.

In another exemplary array substrate according to an embodiment of the present invention, the array substrate includes a first test line, a second test line, a first gate line group, a second gate line group, a source line and a switching device. The first test line extends along a first direction, while the second test line is substantially parallel to the first test line. The first gate line group extends along a second direction that is substantially perpendicular to the first direction, and electrically connected to the first test line. The second gate line group extends along the second direction, and is electrically connected to the second test line. The source line extends along the first direction. The switching device is formed on a region surrounded by the first and second gate lines and the source lines. For example, the first gate line group corresponds to odd numbered gate lines while the second gate line group corresponds to even numbered gate lines, or vice versa.

In still another exemplary array substrate according to an embodiment of the present invention, the array substrate includes a first test line, a second test line, a first gate line group, a second gate line group, a third test line, a fourth test line, a first source line group, a second source line group and a switching device. The first test line extends along a first direction. The second test line is substantially parallel to the first test line. The first gate line group extends along a second direction that is substantially perpendicular to the first direction, and electrically connected to the first test line. The second gate line group extends along the second direction, and is electrically connected the second test line. The third test line extends along the second direction. The fourth test line is substantially parallel to the third test line. The first source line group extends along the first direction, and is electrically connected to the third test line. The second source line group extends along the first direction, and is electrically connected to the fourth test line. The switching device is formed on a region surrounded by the first source line, the second source line, the first gate line, and the second gate line.

According to an exemplary method of manufacturing an array substrate, a first test line, a second test line, and a gate line, which extend along a first direction, are formed. Then, a shorting bar that extends along the first direction, a first source line that extends from the shorting bar along a second direction that is substantially perpendicular to the first direction, a first drain electrode that is separated (or spaced apart) from the first source line by a predetermined distance, a second source line that extends along the second direction such that the second source line is separated from the shorting bar, and a second drain electrode that is separated from the second source line are formed. The first source line and the first drain electrode define a first switching device while the second source line and the second drain electrode define a second switching device. Then, a first bridge pattern that electrically couples the first test line to the source line, a second bridge pattern that electrically couples the second test line to the second source line, a first pixel electrode layer that is electrically connected to the first switching device, and a second pixel electrode layer that is electrically connected to the second switching device are formed.

According to an exemplary method of manufacturing an array substrate, a first test line and a second test line that extend along a first direction, a second shorting bar that extends along a second direction that is substantially perpendicular to the first direction, a first gate line that extends from the second shorting bar along the first direction, and a second gate line group that extends along the first direction and separated from the second shorting bar are formed. Then, a third test line and a fourth test line that extend along the second direction, a first shorting bar that extends along the first direction, a first source line group that extends from the first shorting bar along the second direction, a first drain electrode that is separated from the first source line by a predetermined distance, a second source line group is separated from the first shorting bar and extends along the second direction, and a second drain electrode is separated from the second source line, the first source line group and the second drain electrode defining a second switching device and the second source line group and the second drain electrode defining a second switching element are formed. Then a first bridge pattern coupling the first test line to the source line, a second bridge pattern electrically coupling the second test line to the second source line, a third bridge pattern electrically coupling the third test line to the second gate line, a fourth bridge pattern electrically coupling the fourth test line to the second gate line, a first pixel electrode layer electrically connected to the first switching device, and a second pixel electrode layer electrically connected to the second switching device are formed.

Therefore, the first source lines represent odd numbered source lines or even numbered source lines while the second source lines represent the remaining source lines different from the first source lines. The first source lines extend from the horizontal shorting bar and contact the third wiring test lines. The second source lines are separated from the horizontal shorting bar and contact the fourth wiring test lines.

Accordingly, possible electrostatic damage during the following processes may be avoided by electrically coupling the odd numbered source lines that are connected to the horizontal shorting bar with the wiring test lines in a region defined by the scribe lines for cutting the array substrate. Additionally, the conditions for the 2G1D test are automatically satisfied through coupling the source lines that are disconnected from the horizontal shorting bar, to the fourth wiring test lines adjacent to the third wiring test lines.

According to an embodiment of the invention, the source lines coupled to the horizontal shorting bar are connected with the first wiring test lines and the gate lines coupled to the longitudinal shorting bar are connected with the third wiring test lines, so that the various embodiments may prevent the mother board from being damaged by static electricity.

Additionally, the source lines, which are not coupled to the horizontal shorting bar, are connected with the second wiring test lines and the gate lines, which are not coupled to the longitudinal shorting bar, are connected with the fourth wiring test lines, so that the various embodiments may easily achieve the 2G2D test conditions and additional process such as a metal etching process and a laser trimming process to remove the 1G1D lines may be rendered unnecessary.

In the V/I process, the embodiments according to an embodiment of the invention may improve detection capability of the test process, due to a regulated surface resistance between the odd lines and the even lines, to thereby reduce a brightness discrepancy in the display product. The gate lines and the source lines are respectively connected themselves, even before forming the bridge patterns which are formed during forming the pixel electrodes, so that the embodiments according to an embodiment of the invention may minimize the ill effects caused by static electricity.

BRIEF DESCRIPTION OF THE DRAWINGS

The above and other advantages of the present invention will become readily apparent by reference to the following detailed description when considered in conjunction with the accompanying drawings, wherein.

DETAILED DESCRIPTION OF THE INVENTION

It should be understood that the exemplary embodiments of the present invention described below may be modified in many different ways without departing from the inventive principles disclosed herein, and the scope of the present invention is therefore not limited to these particular following embodiments. Rather, these embodiments are provided so that this disclosure will be thorough and complete, and will fully convey the concept of the invention to those skilled in the art by way of example and not of limitation.

Hereinafter, the embodiments of the present invention will be described in detail with reference to the accompanied drawings. It is noted that various changes, substitutions and alterations can be made herein without departing from the spirit and scope of the invention as defined by embodiments that will be described below. The embodiments are only examples for showing the sprit of the present invention to a person skilled in the art. In the figures, a thickness of layers may be exaggerated for clarity. The term "disposed on" can include "disposed over" so that something may be disposed therebetween. The term "disposed directly on" means that nothing is disposed therebetween.

Embodiment 1

Figure 1:
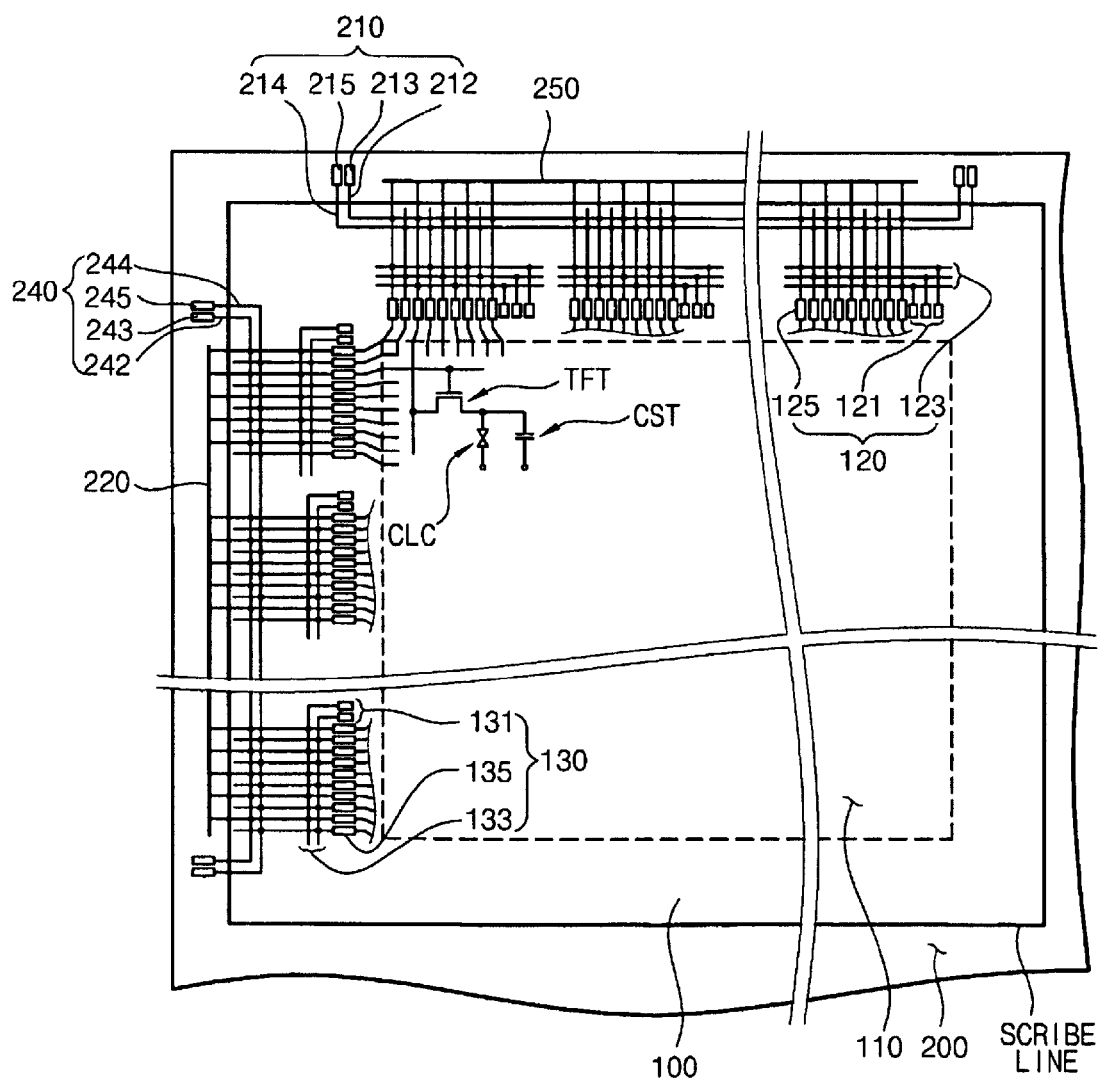
FIG. 1 is a plan view schematically illustrating a portion of a mother board, which corresponds to an array substrate, according to an exemplary embodiment of the invention.
Figure 2:
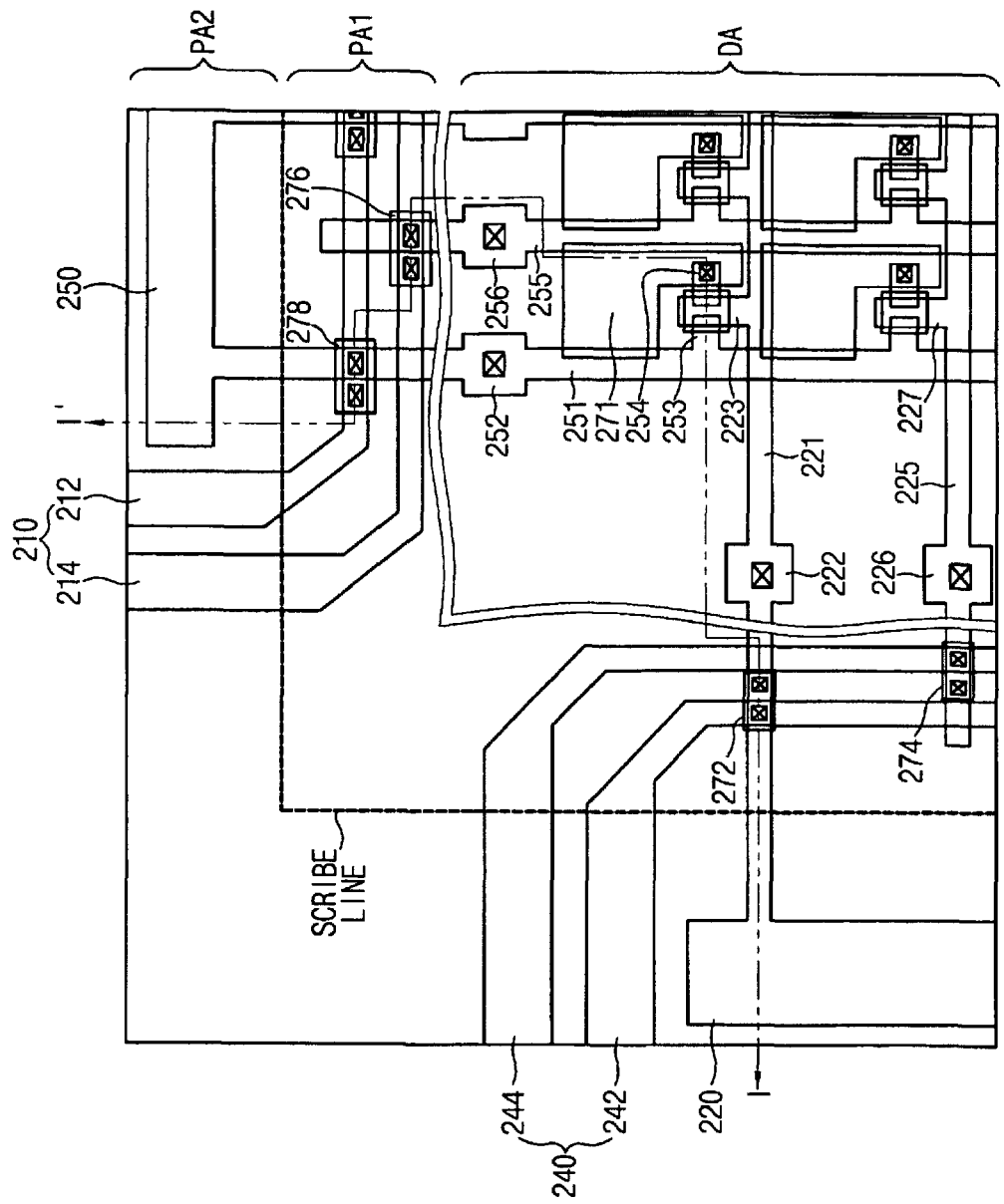
FIG. 2 is a layout view illustrating a portion of the mother board in FIG. 1.

FIG. 1 is a plan view schematically illustrating a portion of a mother board, which corresponds to an array substrate according to an exemplary embodiment of the invention. FIG. 2 is a layout view illustrating a portion of the mother board in FIG. 1.

Referring to FIG. 1, a mother board 200 according to an exemplary embodiment of the invention includes an array substrate 100. In FIG. 1, the mother board 200 is illustrated as including only one array substrate, but the mother board 200 may include two or more array substrates. Each of the array substrates 100 is surrounded by a scribe line. When all of the array substrates are completed, each array substrate is cut out from the mother board 200. The mother board 200 further comprises a first wiring test circuit 210, a longitudinal shorting bar 220, a second wiring test circuit 240 and a horizontal shorting bar 250.

Referring to FIG. 2, the mother board 200 includes a display region DA, a first peripheral region PA1 surrounding the display region DA, and a second peripheral region PA2 surrounding the first peripheral region PA1. The array substrate 100 is formed on the display region DA and the first peripheral region PA1. The first wiring test circuit 210 and the second wiring test circuit 240 are formed on the first peripheral region PA1. The longitudinal shorting bar 220 and the horizontal shorting bar 250 are formed on the second peripheral region PA2. The array substrate 100 includes a pixel section 110 formed on the display region DA, a first visual inspection (V/I) section 120 and a second V/I section 130 formed on the first peripheral region PA1.

Referring again to FIG. 1, the pixel section 110 includes a plurality of source lines, a plurality of gate lines, thin film transistor (TFT) switching devices, a first electrode (or pixel electrode) and a storage capacitor CST. Each of the source lines extends in a first direction, and each of the gate lines extends in a second direction that is substantially perpendicular to the first direction. Each of the TFT switching devices includes a gate electrode that is electrically connected to one of the gate lines, a source electrode that is electrically connected to one of the source lines, and a drain electrode that is electrically connected to the pixel electrode.

The first V/I test section 120 includes a first V/I pad 121, a first V/I line 123, and a plurality of first driving chip pads 125. A first driving chip (not shown) is mounted on the first driving chip pads 125. The first driving chip pads 125 may be grouped according to source lines. For example, a first group of the first driving chip pads 125 may correspond to (3n-2)-th source lines, a second group of the first driving chip pads 125 may correspond to (3n-1)-th source lines, and a third group of the first driving chip pads 125 may correspond to 3n-th source lines, where 'n' is a natural number. The first driving chip pads 125 in a same group are electrically connected to each other through the first V/I line 123, so that the number of first V/I lines is three. The first V/I pad 121 and the first V/I line 123 may be separately formed for each of the first driving chip pads 125. The first V/I pad 121 may have three pads respectively corresponding to the first, second and third groups of the first driving chip pads 125 according to a 3D mode. In other words, the three pads of the first V/I pad 121 correspond to the each of first V/I lines 121.

The second V/I section 130 includes a second V/I pad 131, a second V/I line 133, and a plurality of first driving chip pads 135. A second driving chip (not shown) is mounted on the second driving chip pads 135. The second driving chip pads 135 may be grouped according to gate lines. For example, a first group of the second driving chip pads 135 may correspond to (2n-1)-th gate lines, a second group of the second driving chip pad 135 may correspond to 2n-th source lines, where 'n' is a natural number. The second driving chip pads 135 in a same group are electrically connected to each other through the second V/I line 133, so that the number of second V/I lines is two. The second V/I pad 131 and the first V/I line 133 may be separately formed for each of the second driving chip pads 135. The second V/I pad 131 may have two pads respectively corresponding to the first and second groups of the second driving chip pads 135 according to a 2G mode. In other words, the two pads of the second V/I pad 131 correspond to the each of second V/I lines 131.

Referring now to both FIG. 1 and FIG. 2, the first wiring test circuit 210 is provided with a test signal for testing the electrical operation state (or continuity) of the source lines formed on the array substrate 100. The first wiring test circuit 210 includes a first wiring test pad 213, a second wiring test pad 215, a first wiring test line 212, and a second wiring test line 214. The wiring test corresponds to a voltage test. In other words, the wiring test may be performed through a voltage compensation or a voltage discrepancy reference setting test. Particularly, according to the 2D mode, a first test signal is applied to the odd numbered source lines through the first wiring test pad 213, and a second test signal is applied to the even numbered source lines through the second wiring test pad 215. The first wiring test line 212 is electrically connected to every odd source line, and the second wiring test line 214 is electrically connected to every even source line, according to the 2G mode. The longitudinal shorting bar 220 formed along the first direction prevents external static electricity from directly flowing into the gate lines formed along the second direction. The longitudinal shorting bar 220 electrically connects to the odd numbered gate lines. The second wiring test circuit 240 is provided with a test signal for testing the electrical operation state of the gate lines formed on the array substrate 100. The second wiring test circuit 240 includes a third wiring test pad 243, a fourth wiring test pad 245, a third wiring test line 242, and a fourth wiring test line 244.

Particularly, according to the 2G mode, a third test signal is applied the odd numbered gate lines through the third wiring test pad 243, and a fourth test signal is applied to the even numbered gate lines through the fourth wiring test pad 245. The third wiring test line 242 is electrically connected to the odd numbered gate lines, and the fourth wiring test line 244 is electrically connected to the even numbered gate lines. The second wiring test pad 243 is a pad for applying the first test signal to the odd numbered gate lines, and the second wiring test pad 245 is a pad for applying the second test signal to the even numbered gate lines, according to the 2G mode. The second wiring test line 242 is electrically connected to the odd numbered gate lines, and the second wiring test line 244 is electrically connected to the even number gate lines. The horizontal shorting bar 250 formed along the second direction prevents external static electricity from directly flowing into the source lines formed along the first direction. The horizontal shorting bar 250 electrically connects the odd numbered source lines, according to the 2D mode.

As illustrated as above, electrostatic damage is prevented through electrically coupling the odd numbered source lines 251, which are electrically connected to the horizontal shorting bar 250, to the first wiring test line 212 in the pixel region surrounded by the scribe line, and electrically coupling the odd gate line 221, which is electrically connected to the longitudinal shorting bar 220, to the third wiring test line 242 in the pixel region surrounded by the scribe line. Additionally, the conditions for the 2G2D test are automatically satisfied through coupling the source line 255, which is electrically disconnected with the horizontal shorting bar 250, to the second wiring test line 214 adjacent to the first wiring test line 212, and coupling the gate line 225, which is electrically disconnected with the longitudinal shorting bar 220, to the third wiring test line 242 adjacent to the fourth wiring test line 244.

Figure 3:
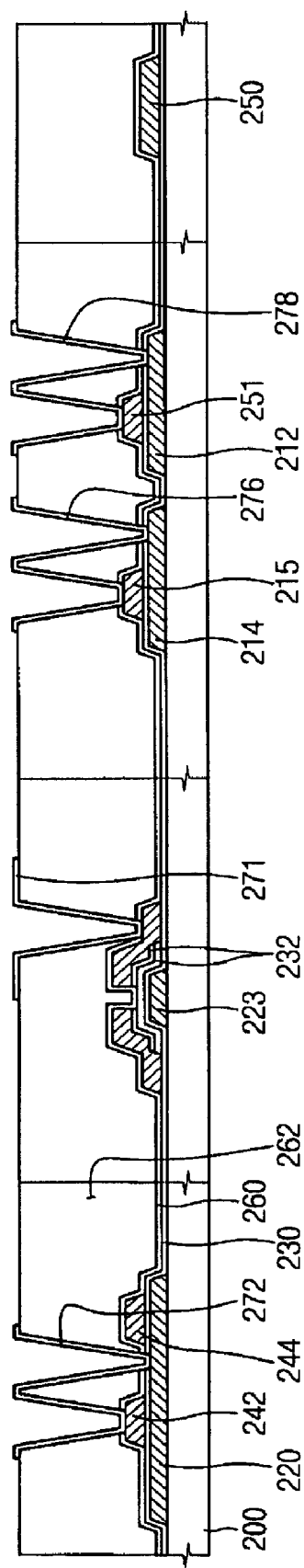
FIG. 3 is cross-sectional view taken along a line I-I' in FIG. 2.

FIG. 3 is cross-sectional view taken along a line I-I' in FIG. 2. Referring to FIGS. 2 and 3, the first wiring test line 212 stretches horizontally within the first peripheral region PA1 of the mother board, while the second wiring test line 214 stretches in parallel with the first wiring test line 212 within the peripheral region PA1. The longitudinal shorting bar 220 is longitudinally extended within the second peripheral region PA2 of the mother board. The third wiring test line 242 extends longitudinally within the first peripheral region PA1 of the mother board, and the fourth wiring test line 244 extends in parallel with the third wiring test line 242 within the first peripheral region PA1. The horizontal shorting bar 250 extends horizontally within the second peripheral region PA2 of the mother board.

The first gate line 221 extends from the longitudinal shorting bar 220 along the horizontal direction, and is electrically connected to the third wiring test line 242. The second gate line 225 extends horizontally, and is electrically connected to the fourth wiring test line 244. The longitudinal shorting bar 220 may be wider than the first gate line 221 and the second gate line 225. For example, the longitudinal shorting bar 220 has a width that is substantially equal to or greater than five times of a width of the first gate line 221 or the second gate line 225.

The first source line 251 extends from the horizontal shorting bar 250 along the longitudinal direction, and is electrically connected to the third wiring test line 212. The second source line 255 extends longitudinally, and is electrically connected to the second wiring test line 214. The horizontal shorting bar 250 may be wider than the first source line 251 and the second source line 255. For example, a width of the horizontal shorting bar 250 is substantially equal to or greater than five times of the first source line 251 or the second source line 255. A TFT switching device and a pixel electrode that is electrically connected to the drain electrode of the TFT switching device are formed in the display region DA, which is defined by two adjacent gate lines and two adjacent source lines. The first wiring test line 212 and the second wiring test line 214 are formed on the first peripheral region PA1 surrounding the display region DA, and the horizontal shorting bar 250 is formed on the second peripheral region PA2 surrounding the first peripheral region PA1.

Figure 4:
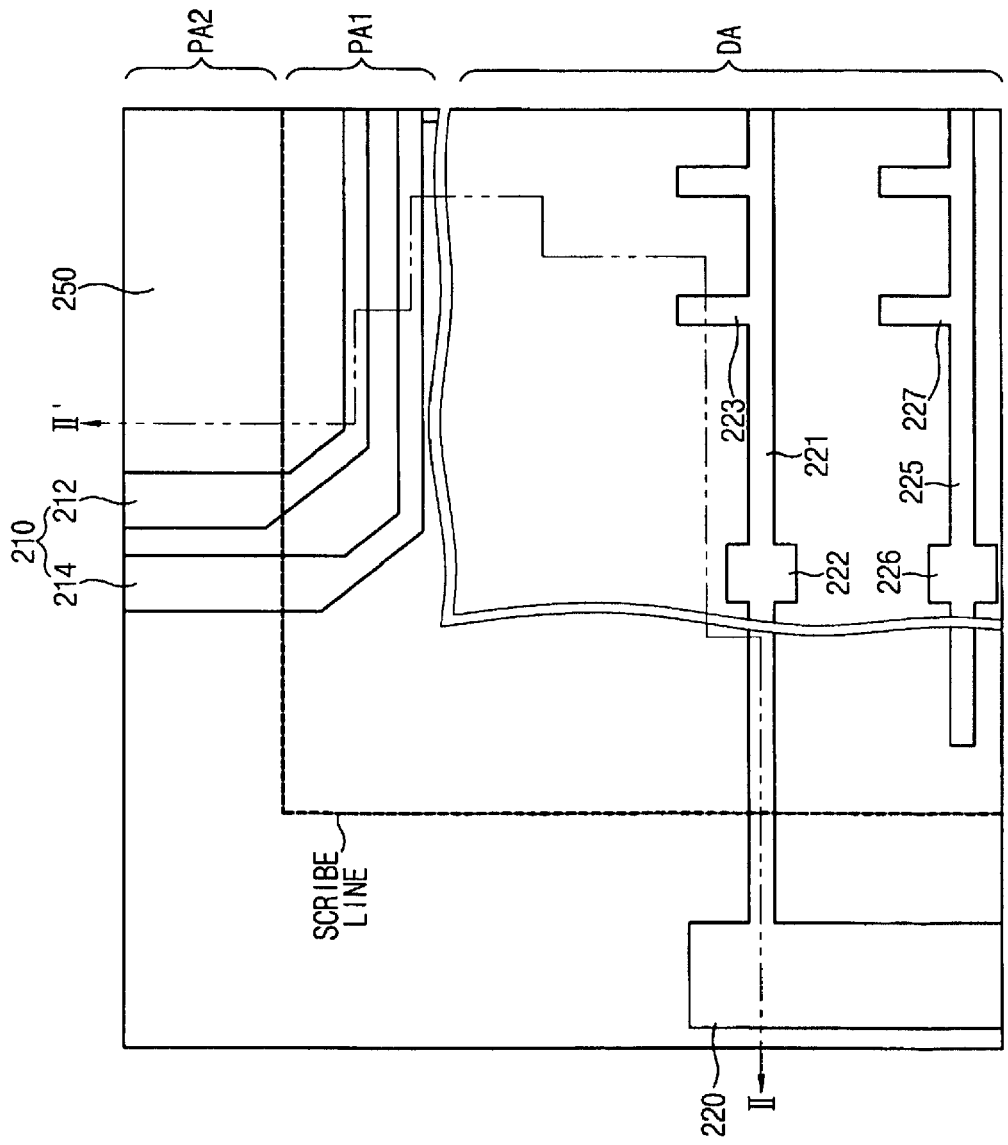
FIG. 4 is a plan view for showing a first manufacturing process of the mother board in FIG. 2.
Figure 5:
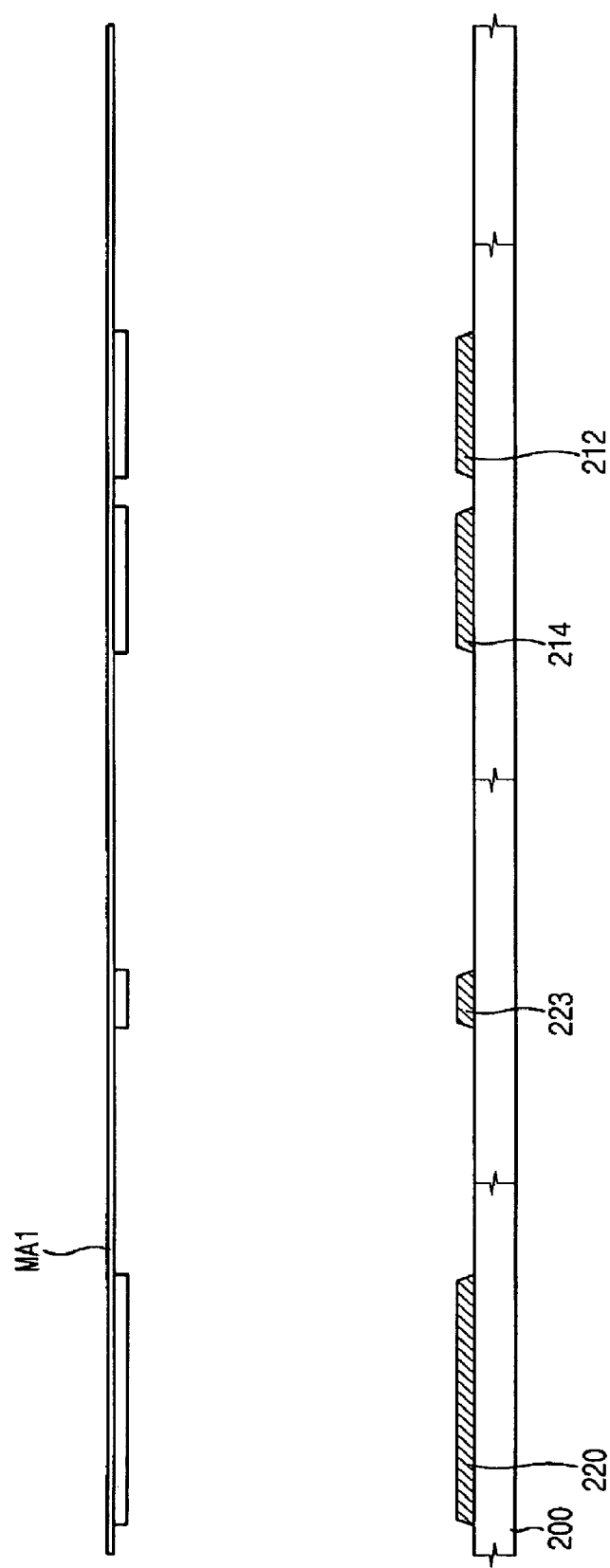
FIG. 5 is a cross-sectional view taken along a line II-II' in FIG. 4.

Hereinafter, a manufacturing process of the mother board according to an embodiment of the present invention will be explained referring to FIGS. 4 to 14. FIG. 4 is a plan view for showing a first manufacturing process of the mother board in FIG. 2. FIG. 5 is a cross-sectional view taken along a line II-II' in FIG. 4. The first manufacturing process includes forming a longitudinal shorting bar electrically connecting the odd numbered gate lines during forming of the gate metal. Referring to FIGS. 4 and 5, a conductive layer is formed on the substrate, for example, through a sputtering method. According to the sputtering method, electrons highly accelerated by the electric field collide with argon (Ar) atoms to ionize the argon atoms into argon ions and electrons, and then the excited argon ions collide with a target object having negative voltage applied thereto in order to scatter the target atoms, so that the scattered target atoms are deposited on the substrate to be vapor-deposited.

After this, the conductive layer is patterned, for example, through a photolithography process using a first mask MA1 to form the first gate line 221, a first gate pad 222 that is electrically coupled to a terminal of the first gate line 221, a first gate electrode 223 that extends from the first gate line 221, the second gate line 225, a second gate pad 226 electrically coupled to a terminal of the second gate line 225, and a second gate electrode 227 that extends from the second gate line 225. The longitudinal shorting bar 220, which electrically connects the odd gate lines, is also formed on the second peripheral region PA2. The longitudinal shorting bar 220 disperses static electricity provided to the gate lines during subsequent processes. The first wiring test line 212 that extends horizontally and the second wiring test line 214 that extends in parallel with the first wiring test line 212 are also formed in the first peripheral region PA1.

Figure 6:
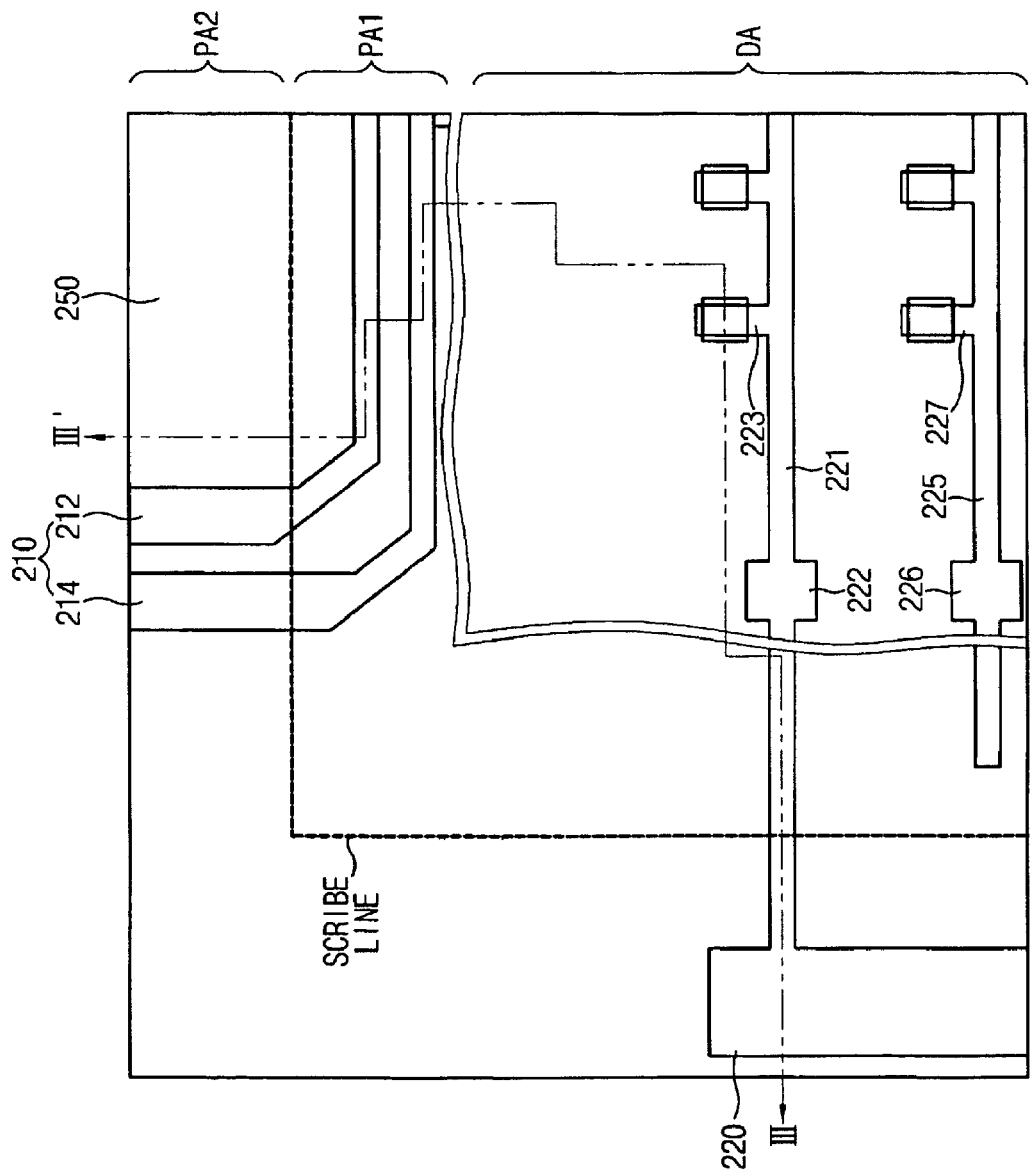
FIG. 6 is a plan view for showing a second manufacturing process of the mother board in FIG. 2.
Figure 7:
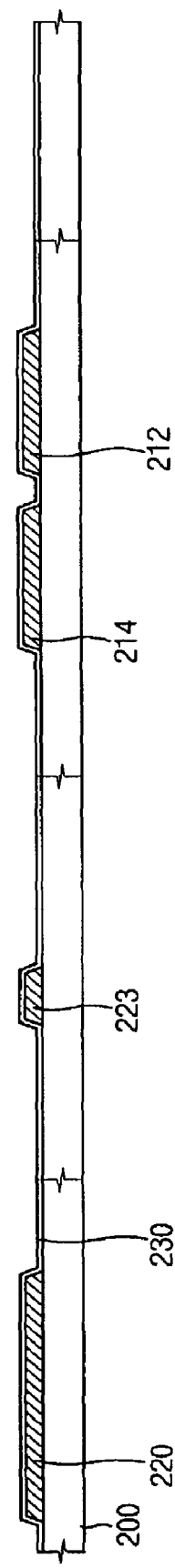
FIGS. 7 and 8 are cross-sectional views taken along a line III-III' in FIG. 6.
Figure 8:
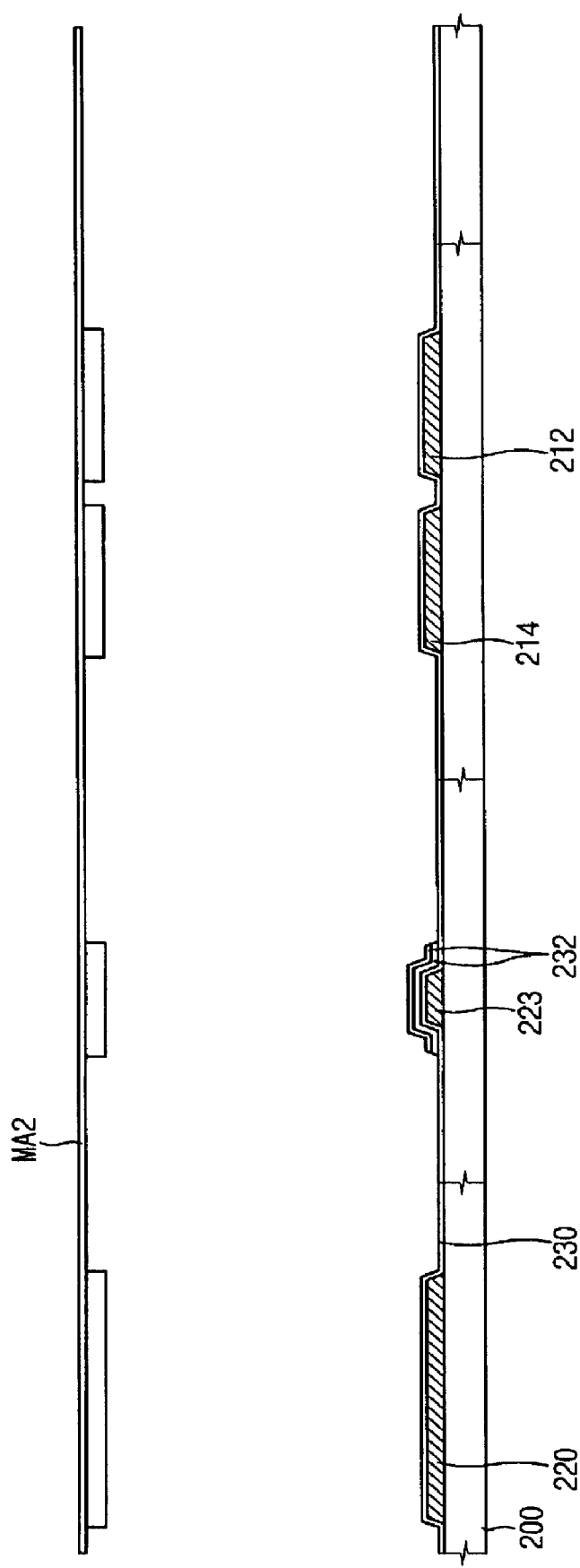

FIG. 6 is a plan view for showing a second manufacturing process of the mother board in FIG. 2. FIGS. 7 and 8 are cross-sectional views taken along a line III-III' in FIG. 6.

Referring to FIGS. 6 to 8, a gate insulation layer 230 including a dielectric material such as silicon nitride (SiNx) is formed on the substrate. After this, an amorphous silicon (a-Si) layer is formed on the substrate, and an n+ amorphous silicon (n+ a-Si) layer is formed on an amorphous silicon layer (a-Si) to form a semiconductor layer 232. The gate insulation layer 230 or the amorphous silicon layer may be formed, for example, through a low temperature chemical vapor deposition (LTCVD), a plasma enhanced chemical vapor deposition (PECVD) or a sputtering method. The semiconductor layer 232 is patterned to form a semiconductor pattern of the thin film transistor (TFT), for example, through the photolithography process using a second mask MA2.

Figure 9:
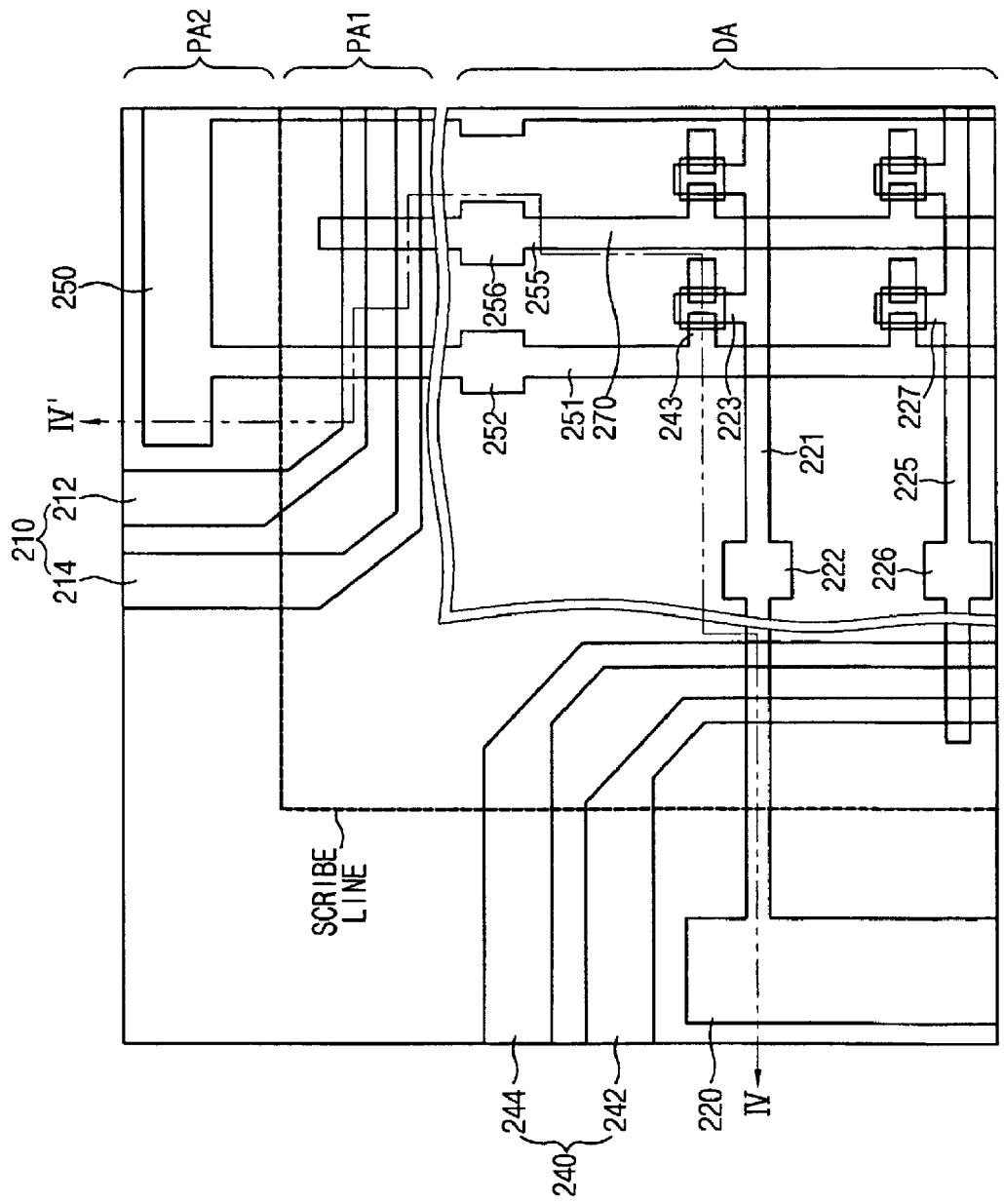
FIG. 9 is a plan view for showing a third manufacturing process of the mother board in FIG. 2.
Figure 10:
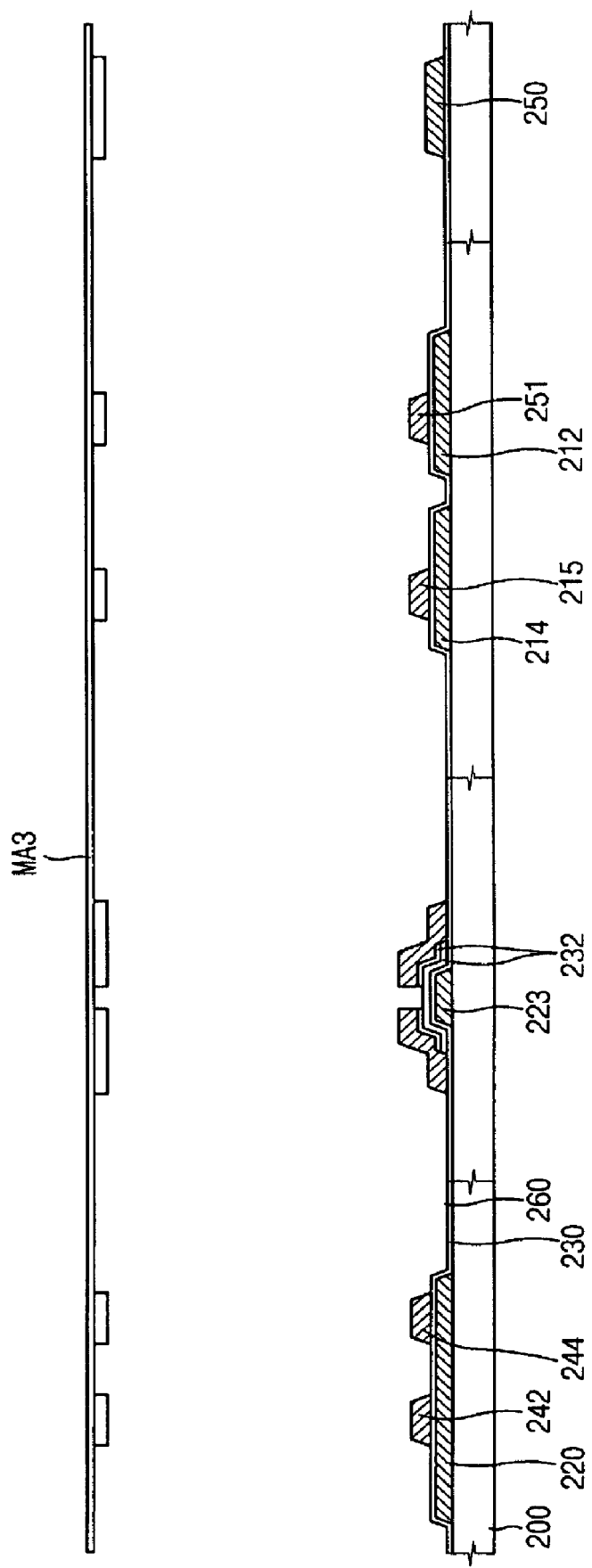
FIGS. 10 and 11 are cross-sectional views taken along a line IV-IV' in FIG. 9.
Figure 11:
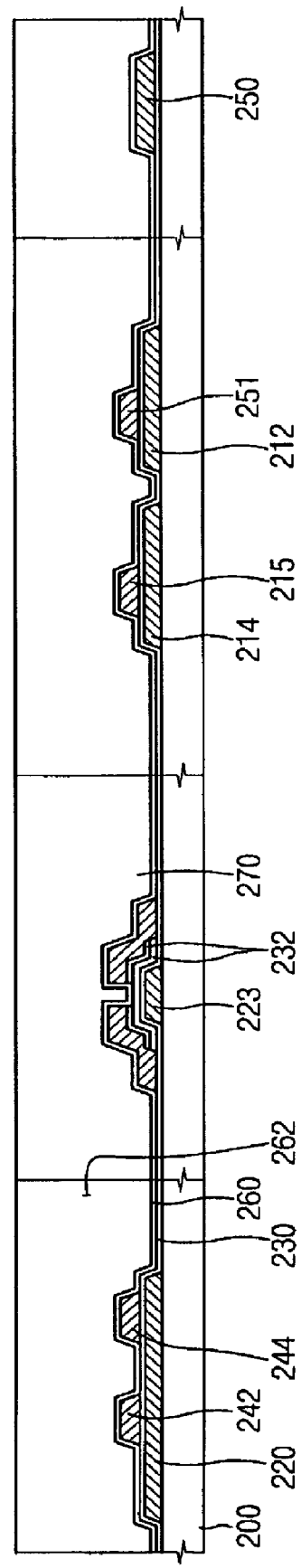

FIG. 9 is a plan view for showing a third manufacturing process of the mother board in FIG. 2. FIGS. 10 and 11 are cross-sectional views taken along a line IV-IV' in FIG. 9. Referring to FIGS. 9 to 11, a conductive layer is formed on the substrate, for example, through sputtering method, and the conductive layer is patterned, for example, through the photolithography using a third mask MA3 to form the source line 251, a source electrode 253 extended from the source line 251, and a drain electrode 254 separated from the source electrode 253. Alternately, the semiconductor layer 232, the source line 251, the source electrode 253 and the drain electrode 254 may be formed through one photolithography process using one mask so as to simplify processes and remove one mask process. After this, a passivation layer 260 such as silicon nitride (SiNx) and an organic insulation layer 262 are sequentially formed to form protective insulation layers. The organic insulation layer 262 may be omitted. In other words, the organic insulation layer 262 is optional.

Figure 12:
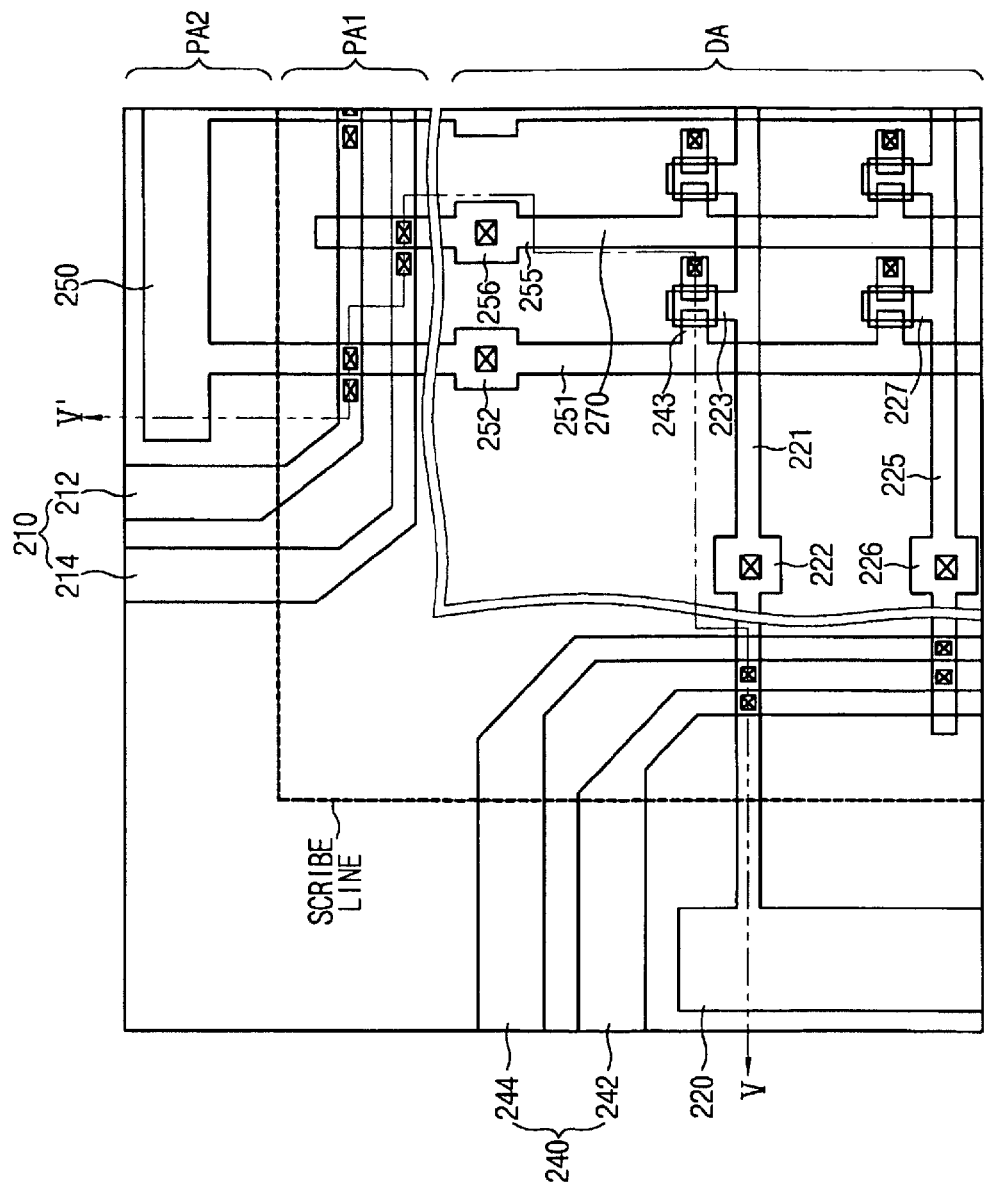
FIG. 12 is a plan view for showing a fifth manufacturing process of the mother board in FIG. 2.
Figure 13:
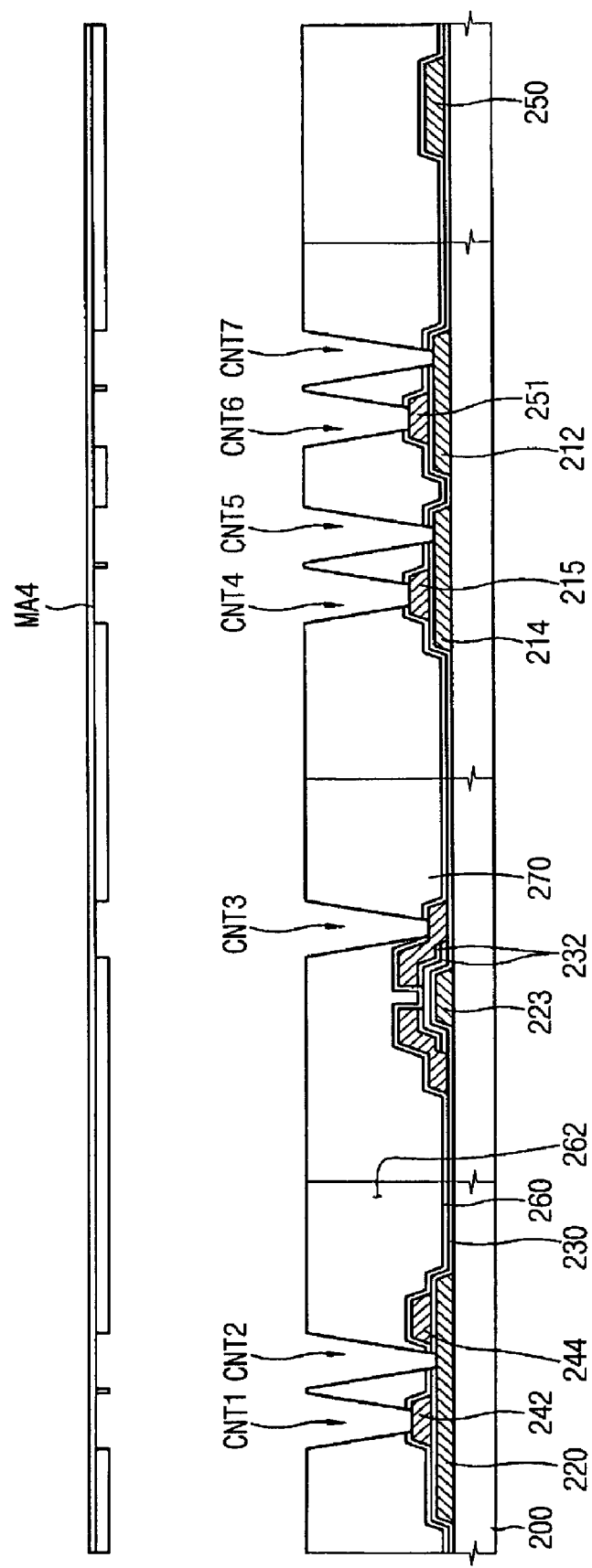
FIG. 13 is a cross-sectional view taken along a line V-V' in FIG. 12.

FIG. 12 is a plan view for showing a fifth manufacturing process of the mother board in FIG. 2. FIG. 13 is a cross-sectional view taken along a line V-V' in FIG. 12. Referring to FIGS. 12 and 13, portions of the protective insulation layers 260 and 262, which are disposed over the drain electrode 254, are removed, for example, through the photolithography process using a fourth mask MA4. Additionally, portions of the protective insulation layers, which are disposed over the gate pad regions, are also removed to expose the first gate pad 222 and the second gate pad 226, and potions of the protective insulation layers, which are over the data pad regions, are removed to expose the first data pad 252 and the second data pad 256.

In more detail, the portions of the protective insulation (passivation) layers 260 and 262 are removed to form a first contact hole CNT1 and a second contact hole CNT2 for electrically connecting the first gate line 221 to the third wiring test line 242, a third contact hole CNT3 for exposing the drain electrode 254 of the switching device, a fourth contact hole CNT4 and a fifth contact hole CNT5 for electrically connecting the second wiring test line 214 to the second source line 255, and a sixth contact hole CNT6 and a seventh contact hole CNT7 for electrically connecting the first wiring test line 212 to the first source line 251. In the same manner, contact holes for electrically connecting the second gate line 225 and the fourth wiring test line 244, contact holes for exposing the first gate pad 222 and the second gate pad 226, and contact holes for exposing the first data pad 252 and the second data pad 256 are also formed in the protective insulation (passivation) layer.

Figure 14:
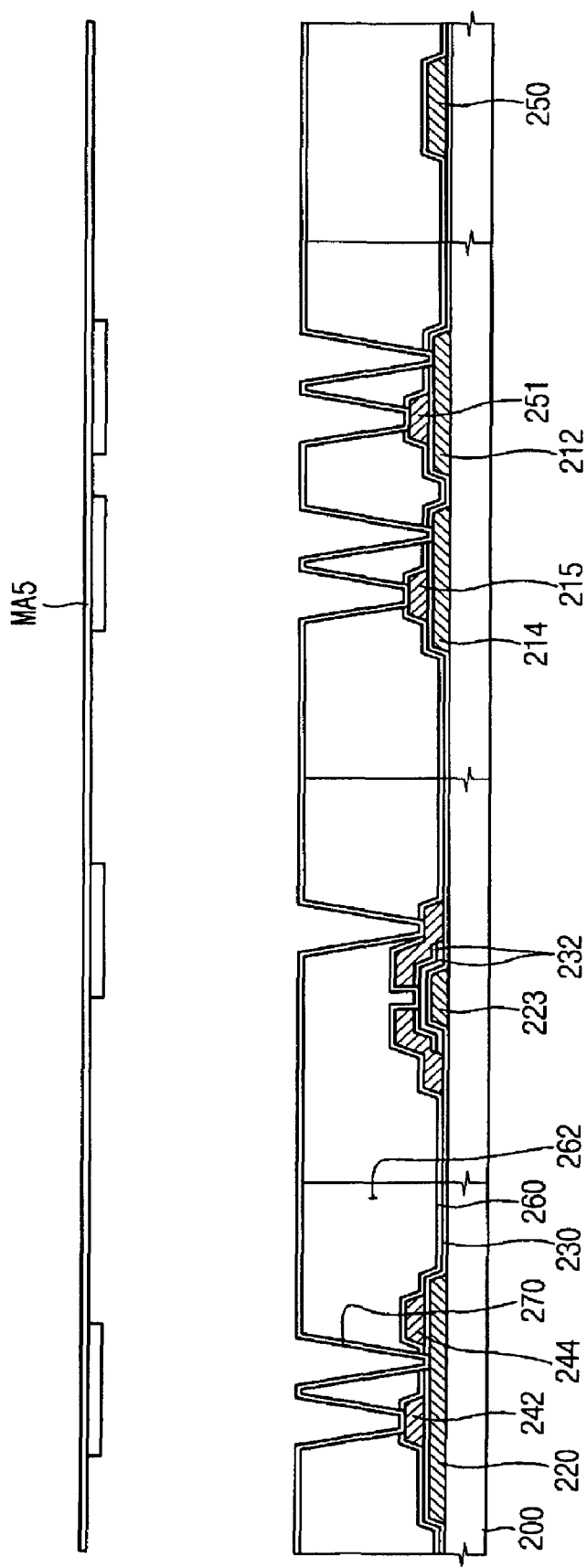
FIG. 14 is a cross-sectional view for showing a sixth manufacturing process of the mother board in FIG. 2.

FIG. 14 is a cross-sectional view showing a sixth manufacturing process of the mother board in FIG. 2. Referring to FIGS. 2, 3 and 14, an optically transparent and electrically conductive layer including, for example, indium tin oxide (ITO), is formed on the protective insulation layers 260 and 262. The optically transparent and electrically conductive layer is patterned, for example, through the photolithography process using a fifth mask MA5 to form the pixel electrode 271 and the bridge patterns 272, 274, 276 and 278. In more detail, a first bridge pattern 272 electrically connects the third wiring test line 242 to the first gate line 221 extending from the longitudinal shorting bar 220. A second bridge pattern 274 electrically connects the fourth wiring test line 244 to the second gate line 225 separated from the longitudinal shorting bar 220. A fourth bridge pattern 276 electrically connects the second wiring test line 214 to the second source line 255 that is separated from the horizontal shorting bar 250. A third bridge pattern 278 electrically connects the first wiring test line 212 to the first source line 251 that extends from the horizontal shorting bar 250. Therefore, a wiring test of 2G2D mode could be automatically achieved. When the array substrate is separated from the mother board, the odd numbered lines electrically connected to each other through the shorting bar are electrically separated from each other. Then, the V/I process may be uniformly achieved due to uniform resistances between the adjacent odd or even number shorting bar lines. When the V/I process is finished, the shorting bars are removed by a glass edge grinding method or a laser trimming method, and then a gross test is performed or a driver IC is mounted.

As described above, according to an embodiment of the invention, the first source line group corresponds to the odd numbered source lines or the even numbered source lines, and the second source line group corresponds to the remaining source lines other than the first source lines. The first gate line group corresponds to the odd number gate lines or the even number gate lines and the second gate lines correspond to the remaining gate lines other than the first gate lines. The first source lines extend from the horizontal shorting bar, and contact the first wiring test lines. The second source lines are separated from the horizontal shorting bar, and contact the second wiring test lines. The first gate lines extend from the longitudinal shorting bar, and contact the third wiring test lines. The second gate lines are separated from the longitudinal shorting bar, and contact the fourth wiring test lines.

Accordingly, possible electrostatic damage during subsequent processes may be prevented by electrically coupling the odd number source lines with each other, which are electrically connected to the horizontal shorting bar, with the wiring test lines in a region defined by the scribe lines. Additionally, the conditions for the 2G2D V/I test are automatically satisfied through electrically coupling the third wiring test line, which is disconnected from the horizontal shorting bar, with the fourth wiring test line adjacent to the third wiring test line. The even numbered source lines or gate lines may extend from the horizontal or longitudinal shorting bars, while the odd number source lines or gate lines are separated from the horizontal or longitudinal shorting bars.

Embodiment 2

Figure 15:
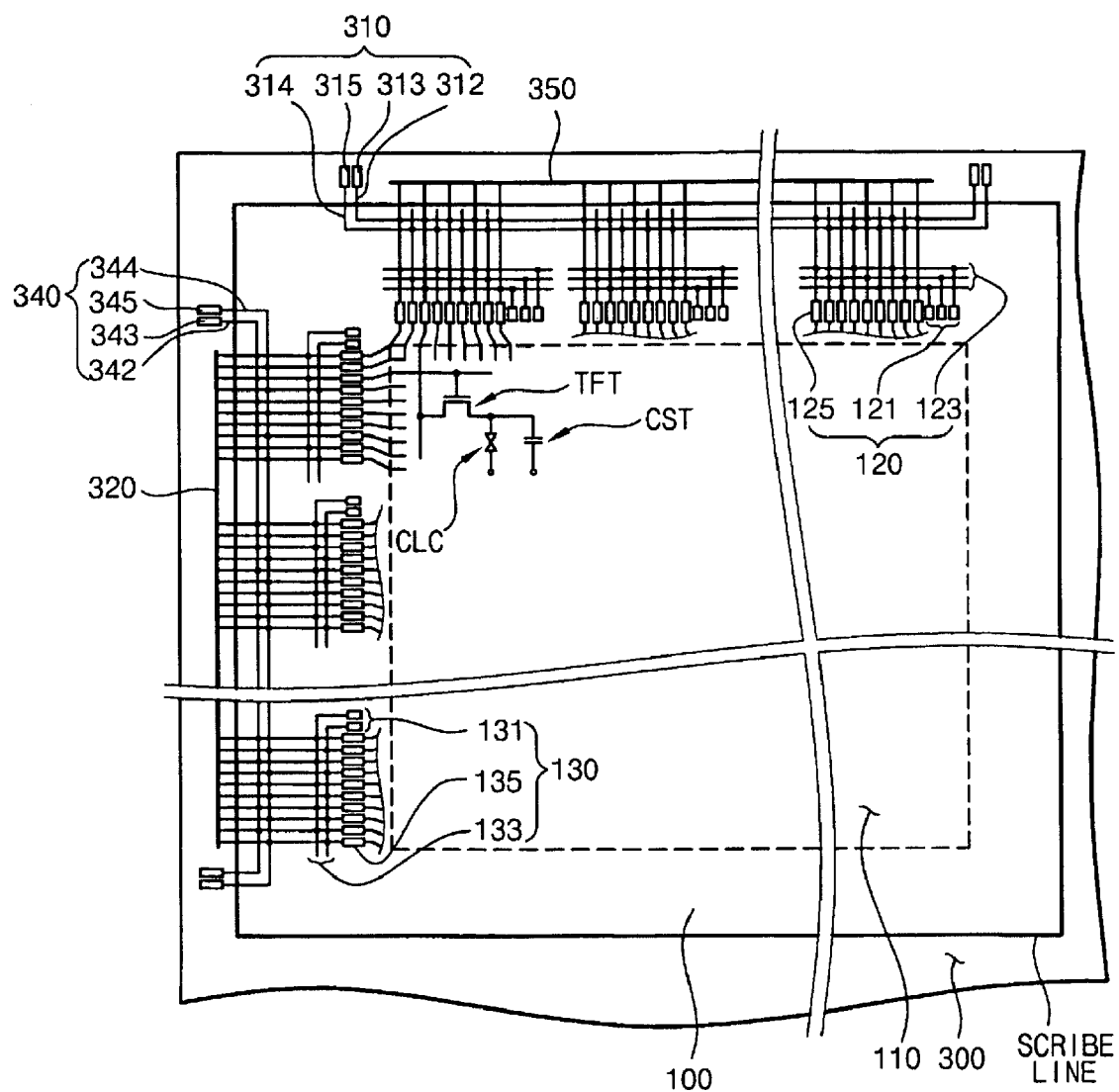
FIG. 15 is a plan view schematically illustrating a portion of a mother board, which corresponds to an array substrate, according to another exemplary embodiment of the invention.
Figure 16:
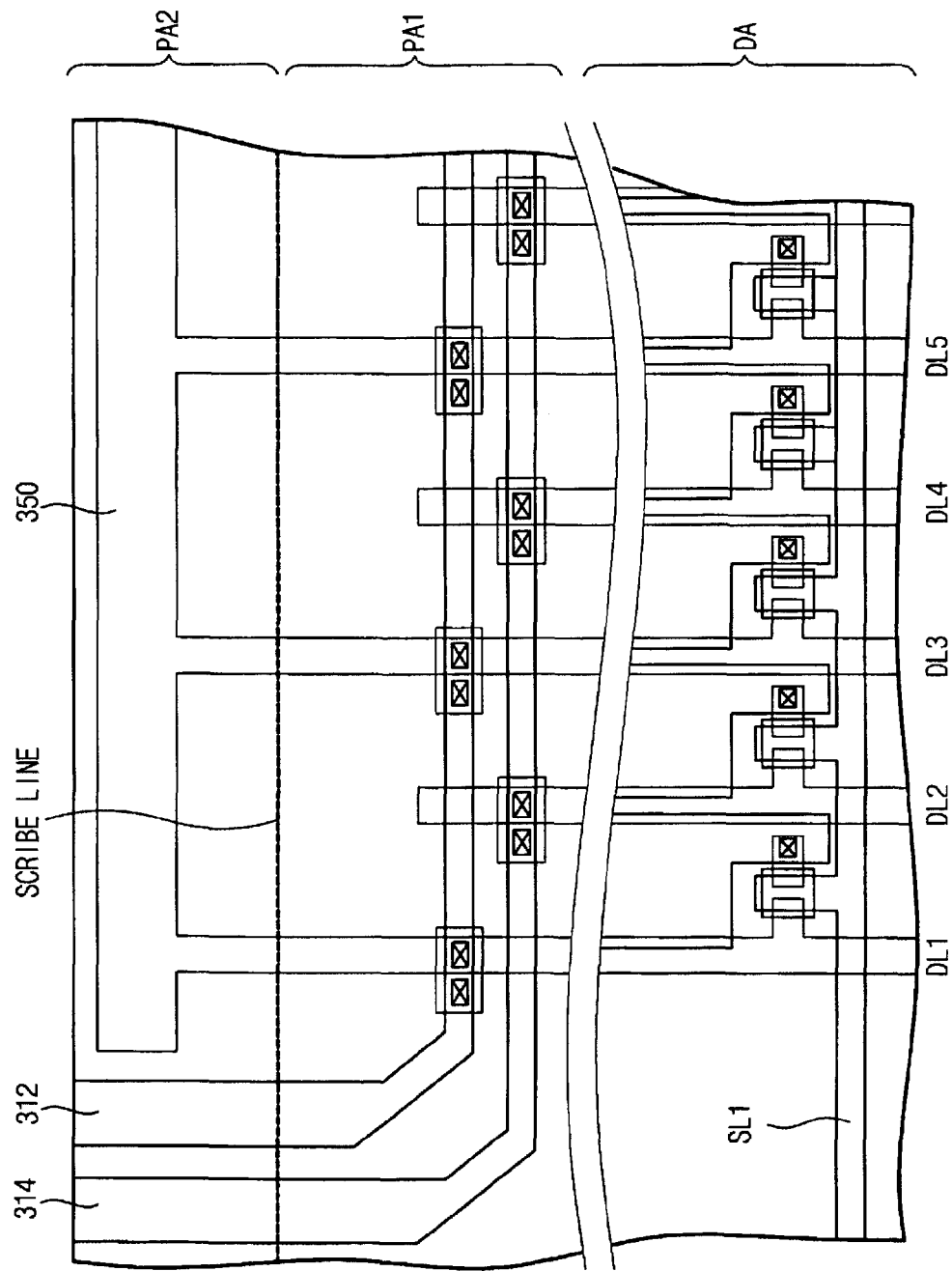
FIG. 16 is a layout view illustrating a portion of the mother board in FIG. 15.

FIG. 15 is a plan view schematically illustrating a portion of a mother board, which corresponds to an array substrate according to another exemplary embodiment of the invention. FIG. 16 is a layout illustrating a portion of the mother board in FIG. 15. Referring to FIGS. 15 and 16, a mother board according to the present embodiment includes an array substrate 100 defined by scribe lines, a first wiring test circuit 310, a longitudinal shorting bar 320, a second wiring test circuit 340, and a horizontal shorting bar 350. The same elements as in FIG. 1 are represented by the same reference numerals and thus detailed descriptions about the same elements will be omitted.

As shown, the mother board 300 includes a display region DA, a first peripheral region PA1 surrounding the display region DA, and a second peripheral region PA2 surrounding the first peripheral region PA1. The array substrate 100 is formed on the display region DA and the first peripheral region PA1. The first wiring test circuit 310 and the second wiring test circuit 340 are formed on the first peripheral region PA1. The longitudinal shorting bar 320 and the horizontal shorting bar 350 are formed on the second peripheral region PA2. As in FIG. 1, the mother board 200 is illustrated as including only one array substrate, but the mother board 200 may include two or more array substrates. A test signal for testing the electrical operation state (or continuity) of source lines formed on the array substrate 100 is applied to the first wiring test circuit 310. The first wiring test circuit 310 includes a first wiring test pad 313, a second wiring test pad 315, a first wiring test line 312, and a second wiring test line 314.

For example, according to the 2D mode, a first test signal is applied to the odd numbered source lines through the first wiring test pad, and a second test signal is applied to the even numbered source lines through the second wiring test pad 315. The first wiring test line 312 is electrically connected to the odd numbered source lines, while the second wiring test line 314 is electrically connected to the even numbered source lines. The longitudinal shorting bar 320 formed along the first direction prevents external static electricity from directly flowing into the gate lines formed along the second direction. The longitudinal shorting bar 320 electrically connects the gate lines, according to a 1G mode. The longitudinal shorting bar 320 is disposed outside the second wiring test circuit 340.

The second wiring test circuit 340 is provided with a test signal for testing the electrical operation state (or continuity) of multiple gate lines formed on the array substrate 100. The second wiring test circuit 340 includes a third wiring test pad 343, a fourth wiring test pad 345, a third wiring test line 342, and a fourth wiring test line 344. Particularly, according to the 2G mode, a third test signal is applied the odd numbered gate lines through the third wiring test pad 343, and a fourth test signal is applied to the even numbered gate lines through the fourth wiring test pad 345. The third wiring test line 342 is electrically connected to the odd numbered gate lines, and the fourth wiring test line 344 is electrically connected to the even numbered gate lines. The horizontal shorting bar 350 formed along the second direction prevents external static electricity from directly flowing into the source lines formed along the first direction. The horizontal shorting bar 350 electrically connects the odd numbered source lines, according to the 2D mode.

As described as above, in the embodiments according to the invention, the first source lines represent odd numbered source lines or even numbered source lines and the second source lines represent the remaining source lines other than the first source lines. The first source lines extend from the horizontal shorting bar, and contact the first wiring test lines. The second source lines are separated from the horizontal shorting bar, and contact the second wiring test lines.

Accordingly, electrostatic damage during the subsequent processes can be prevented through electrically coupling the odd numbered source lines, which are electrically connected to the horizontal shorting bar, with the wiring test lines in a region defined by the scribe lines. Additionally, the conditions for the 1G2D test are automatically satisfied through coupling the source lines, which are disconnected from the horizontal shorting bar, to the fourth wiring test lines adjacent to the third wiring test lines.

Embodiment 3

Figure 17:
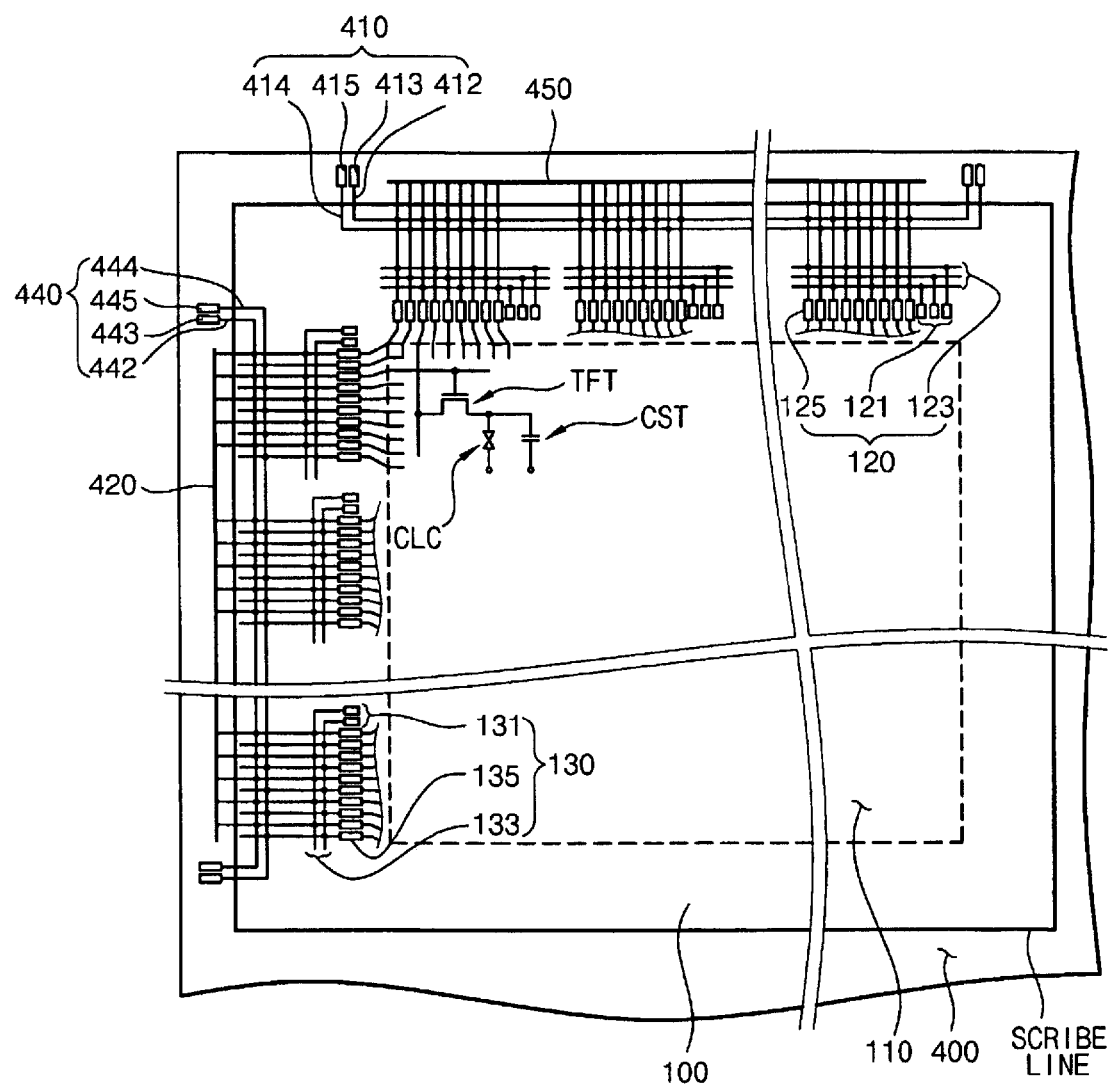
FIG. 17 is a plan view schematically illustrating a portion of a mother board, which corresponds to an array substrate according to still another exemplary embodiment of the invention.
Figure 18:
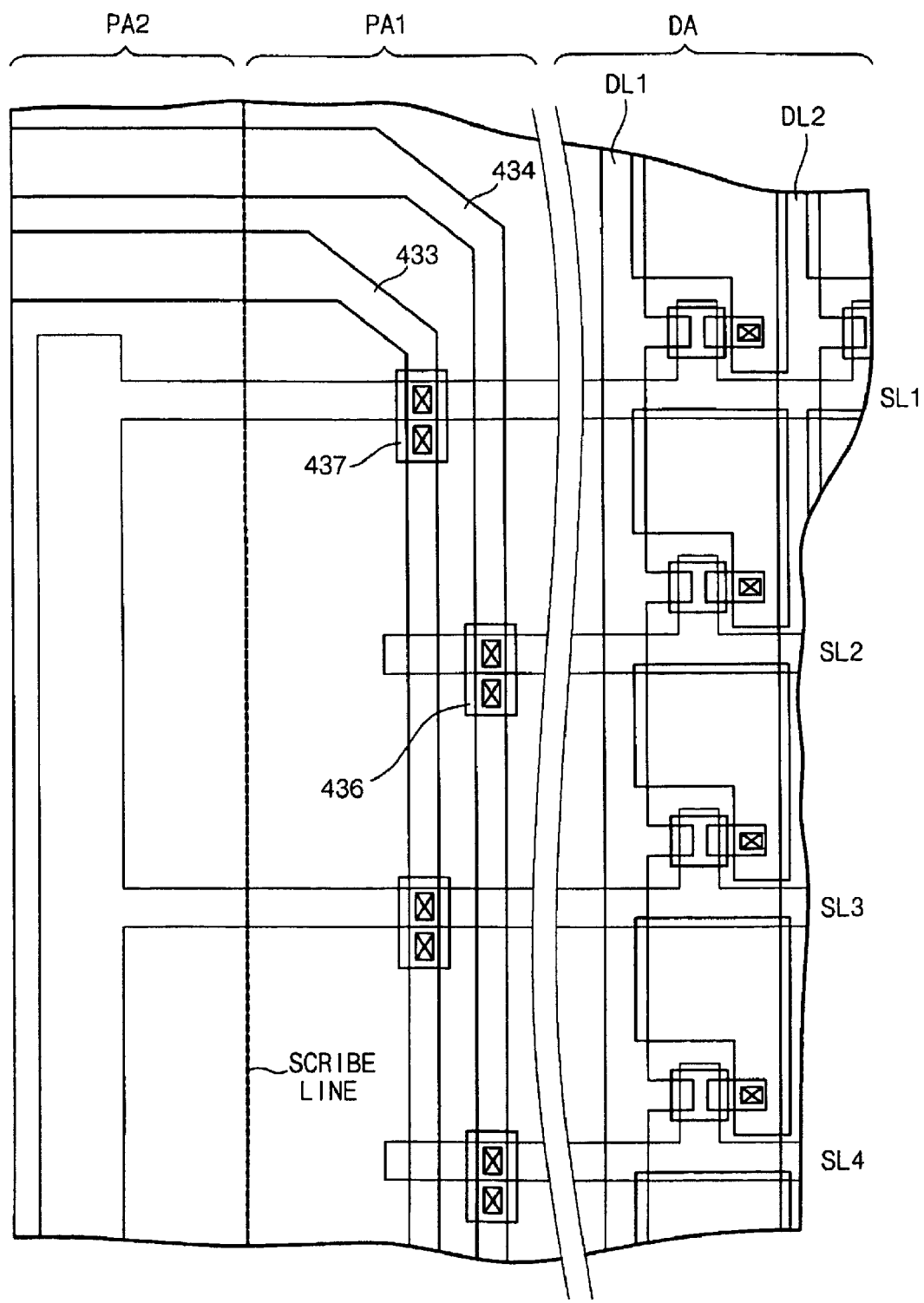
FIG. 18 is a plan view illustrating a portion of the mother board in FIG. 17.

FIG. 17 is a plan view schematically illustrating a portion of a mother board, which corresponds to an array substrate according to still another exemplary embodiment of the invention. FIG. 18 is a plan view illustrating a portion of the mother board in FIG. 17. Referring to FIGS. 17 and 18, the mother board 400 according to the present embodiment includes an array substrate 100 defined by scribe lines, a first wiring test circuit 410, a longitudinal shorting bar 420, a second wiring test circuit 440, and a horizontal shorting bar 450. The same elements as in FIG. 1 are represented by the same reference numerals and thus detailed explanations about the identical elements will be omitted.

The mother board 400 is divided into a display region DA, a first peripheral region PA1 surrounding the display region DA, and a second peripheral region PA2 surrounding the first peripheral region PA1. The array substrate 100 is formed on the display region DA and the first peripheral region PA1. The first wiring test circuit 410 and the second wiring test circuit 440 are formed on the first peripheral region PA1. The longitudinal shorting bar 420 and the horizontal shorting bar 450 are formed on the second peripheral region PA2. The mother board 400 is illustrated as including only one array substrate on FIGS. 17 and 18, but the mother board 400 may include two or more array substrates.

The first wiring test circuit 410 is provided with a test signal for testing the electrical operation state (or continuity) of the source lines formed on the array substrate 100. The first wiring test circuit 410 includes a first wiring test pad 413, a second wiring test pad 415, a first wiring test line 412, and a second wiring test line 414. For example, according to the 2D mode, a first test signal is applied to the odd numbered source lines through the first wiring test pad 413, and a second test signal is applied to the even numbered source lines through the second wiring test pad 315. The first wiring test line 312 is electrically connected to the odd numbered source lines, and the second wiring test line 314 is electrically connected to the even numbered source lines. The longitudinal shorting bar 420 formed along the first direction prevents external static electricity from directly flowing into the gate lines formed along the second direction. The longitudinal shorting bar 420 is electrically connected to the odd numbered gate lines among the multiple gate lines, according to the 2G mode. The second wiring test circuit 440 is provided with a test signal for testing electrical operation state of gate lines formed on the array substrate 100. The second wiring test circuit 440 includes second wiring test pads 443 and 445, second wiring test lines 442 and 444.

The second wiring test pad 443 applies the first test signal to the odd number gate lines, while the second wiring test pad 445 applies the second test signal to the even numbered gate lines, according to the 2G mode. The second wiring test line 442 is electrically connected to the odd numbered gate lines, while the second wiring test line 444 is electrically connected to the even numbered gate lines. The horizontal shorting bar 450 prevents external static electricity from directly flowing into the source lines formed longitudinally on the array substrate 100. The horizontal shorting bar 450 may include longitudinally formed lines binding the source lines onto the outermost part of the first wiring test circuit 410, according to the 1D mode.

As described as above, in the embodiments according to the present invention, the first source lines represent odd numbered source lines or even numbered source lines and the second source lines represent the remaining source lines other than the first source lines. The first source lines extend from the horizontal shorting bar, and contact the third wiring test lines. The second source lines are separated from the horizontal shorting bar, and contact the fourth wiring test lines.

Accordingly, possible electrostatic damage during subsequent processes may be avoidable through electrically coupling the odd numbered source lines, which are connected to the horizontal shorting bar, with the wiring test lines in an region defined by the scribe lines. Additionally, the conditions for the 2G1D test are automatically satisfied through coupling the source lines, which are disconnected from the horizontal shorting bar, to the fourth wiring test lines adjacent to the third wiring test lines.

According to an embodiment of the invention, the source lines coupled to the horizontal shorting bar are connected with the first wiring test lines and the gate lines coupled to the longitudinal shorting bar are connected with the third wiring test lines, so that the embodiments may prevent the mother board from being damaged by static electricity. Additionally, the source lines, which are not coupled to the horizontal shorting bar, are connected with the second wiring test lines and the gate lines, which are not coupled to the longitudinal shorting bar, are connected with the fourth wiring test lines, so that the embodiments may easily accomplish the 2G2D test conditions and an additional process such as a metal etching process and a laser trimming process to remove the 1G1D lines may become unnecessary. In the V/I process, the embodiments according to the invention may improve detection capability of the test process, due to a regulated surface resistance between the odd lines and the even lines, to thereby reduce a brightness discrepancy in the display product. The gate lines and the source lines are respectively connected to each other, even before forming the bridge patterns which are formed during forming the pixel electrodes, so that the embodiments according to the invention may minimize the ill effects caused by static electricity.

While the exemplary embodiments of the present invention and its advantages have been described in detail, it should be understood that various changes, substitutions and alterations can be made herein without departing from the scope of the invention as defined by the appended claims.

What is claimed is:

1. An array substrate comprising:
   a first test line formed on a substrate and extending along a first direction;
   a second test line disposed substantially in parallel with the first test line;
   a first source line extending along a second direction substantially perpendicular to the first direction, the first source line being electrically connected to the first test line;
   a second source line extending along the second direction, the second source line being electrically connected to the second test line;
   a plurality of gate lines, each gate line extending along the first direction;
   a first shorting bar extending along the first direction, the first source line extending from the first shorting bar along the second direction, the second source line extending along the second direction such that the second source line is separated from the first shorting bar; and
   a switching device formed on a region surrounded by the first source line, the second source line, and the plurality of gate lines.

2. The array substrate of claim 1, further comprising:
   a pixel electrode layer electrically coupled to the switching device,
   wherein the first test line and the first source line are electrically connected to each other by a first bridge pattern being composed of a same material as that of the pixel electrode layer, and
   wherein the second test line and the second source line are electrically connected to each other by a second bridge pattern being composed of a same material as that of the pixel electrode layer.

3. The array substrate of claim 1, wherein the first source line comprises odd numbered source lines and the second source line comprises even numbered source lines.

4. The array substrate of claim 1, wherein the first source line comprises even numbered source lines and the second source line comprises odd numbered source lines.

5. The array substrate of claim 1, wherein the first test line and the second test line are formed in a first peripheral region surrounding a display region on which the switching device is formed, and the first shorting bar is formed in a second peripheral region surrounding the first peripheral region.

6. The array substrate of claim 1, further comprising:
   a third test line formed on the substrate and extending along the second direction;
   a fourth test line disposed substantially in parallel with the third test line; and
   a second shorting bar extending along the second direction, wherein the plurality of gate lines comprises:
   a first gate line extending from the second shorting bar along the first direction, the first gate line being electrically connected to the third test line;
   a second gate line extending along the first direction, the second gate line being electrically connected to the fourth test line.

7. The array substrate of claim 6, further comprising:
   a pixel electrode layer electrically coupled to the switching device,
   wherein the third test line and the first gate line are electrically connected to each other by a third bridge pattern being composed of a same material as that of the pixel electrode layer, and
   wherein the fourth test line and the second gate line are electrically connected to each other by a fourth bridge pattern being composed of a same material as that of the pixel electrode layer.

8. The array substrate of claim 6, wherein the first gate line comprises odd numbered gate lines and the second gate line comprises even numbered gate lines.

9. The array substrate of claim 6, wherein the first gate line comprises even numbered gate lines and the second gate line comprises odd numbered gate lines.

10. The array substrate of claim 6, wherein the third test line and the fourth test line are formed in a first peripheral region surrounding a display region on which the switching device is formed, and the second shorting bar is formed in a second peripheral region surrounding the first peripheral region.

11. An array substrate comprising:
    a first test line disposed on a substrate;
    a second test line disposed on the substrate;
    a first shorting bar disposed on the substrate;
    a first gate line extending along a first direction;
    a third test line disposed on the substrate and extending along a second direction that is substantially perpendicular to the first direction, the third test line being electrically connected to the first gate line;
    a fourth test line disposed substantially in parallel with the third test line;

a second gate line extending along the first direction, the second gate line being electrically connected to the fourth test line;
a plurality of source lines extending along the second direction;
a second shorting bar extending along the second direction, the first gate line extending from the second shorting bar along the first direction, the second gate line extending along the first direction such that the second gate line is separated from the second shorting bar; and
a switching device formed on a region surrounded by the first gate line, the second gate line, and the plurality of source lines.

12. The array substrate of claim 11, further comprising:
a pixel electrode layer electrically coupled to the switching device,
wherein the third test line and the first gate line are electrically connected to each other by a first bridge pattern being composed of a same material as that of the pixel electrode layer, and
wherein the fourth test line and the second gate line are electrically connected to each other by a second bridge pattern being composed of the same material as that of the pixel electrode layer.

13. The array substrate of claim 11, wherein the first gate line comprises odd numbered gate lines and the second gate line comprises even numbered gate lines.

14. The array substrate of claim 11, wherein the first gate line comprises even numbered gate lines and the second gate line comprises odd numbered gate lines.

15. The array substrate of claim 11, wherein the third test line and the fourth test line are formed in a first peripheral region surrounding a display region on which the switching device is formed, and the second shorting bar is formed in a second peripheral region surrounding the first peripheral region.

16. The array substrate of claim 11, wherein
the first test line extends along the first direction,
the second test line is disposed substantially in parallel with the first test line,
the first shorting bar extends along the first direction,
the plurality of source lines comprises
a first source line extending from the first shorting bar along the second direction, the first source line being electrically connected to the first test line, and
the plurality of source lines further comprises a second source line extending along the second direction, the second source line being electrically connected to the second test line.

17. The array substrate of claim 16, further comprising:
a pixel electrode layer electrically coupled to the switching device,
wherein the first test line and the first source line are electrically connected to each other by a third bridge pattern being composed of a same material as that of the pixel electrode layer, and
wherein the second test line and the second source line are electrically connected to each other by a fourth bridge pattern being composed of a same material as that of the pixel electrode layer.

18. The array substrate of claim 16, wherein the first source line comprises odd numbered source lines and the second source line comprises even numbered source lines.

19. The array substrate of claim 16, wherein the first source line comprises even numbered source lines and the second source line comprises odd numbered source lines.

20. The array substrate of claim 16, wherein the first test line and the second test line are formed in a first peripheral region surrounding a display region on which the switching device is formed, and the first shorting bar is formed in a second peripheral region surrounding the first peripheral region.

21. An array substrate comprising:
a first test line formed on a substrate and extending along a first direction;
a second test line disposed substantially in parallel with the first test line;
a first source line extending along a second direction substantially perpendicular to the first direction, the first source line being electrically connected to the first test line;
a second source line extending along the second direction, the second source line being electrically connected to the second test line;
a first shorting bar extending along the first direction, the first source line extending from the first shorting bar along the second direction, the second source line extending along the second direction such that the second source line is separated from the first shorting bar;
a third test line extending along the second direction;
a fourth test line disposed substantially in parallel with the third test line;
a first gate line extending along the first direction, the first gate line being electrically connected to the third test line;
a second gate line extending along the first direction, the second gate line being electrically connected to the fourth test line;
a second shorting bar extending along the second direction, the first gate line extending from the second shorting bar, the second gate line extending such that the second gate line is separated from the second shorting bar; and
a switching device formed on a region surrounded by the first gate line, the second gate line, the first source line, and the fourth source line.

22. The array substrate of claim 21, further comprising:
a pixel electrode layer electrically coupled to the switching device,
wherein the first test line and the first source line are electrically connected to each other by a first bridge pattern being composed of a same material as that of the pixel electrode layer,
wherein the second test line and the second source line are electrically connected to each other by a second bridge pattern being composed of a same material as that of the pixel electrode layer,
wherein the third test line and the first gate line are electrically connected to each other by a third bridge pattern being composed of a same material as that of the pixel electrode layer, and
wherein the fourth test line and the second gate line are electrically connected to each other by a fourth bridge pattern being composed of a same material as that of the pixel electrode layer.

23. The array substrate of claim 21, wherein the first source line comprises odd numbered source lines and the second source line comprises even numbered source lines.

24. The array substrate of claim 21, wherein the first source line comprises even numbered source lines and the second source line comprises odd numbered source lines.

25. The array substrate of claim 21, wherein the first gate line comprises odd numbered gate lines and the second gate line comprises even numbered gate lines.

26. The array substrate of claim 21, wherein the first gate line comprises even numbered gate lines and the second gate line comprises odd numbered gate lines.

27. The array substrate of claim 21, wherein the first test line, the second test line, the third test line, and fourth test line are formed in a first peripheral region surrounding a display region on which the switching device is formed, and the first shorting bar and the second shorting bar are formed in a second peripheral region surrounding the first peripheral region.

* * * * *